(12) United States Patent
Wang

(10) Patent No.: US 11,264,468 B2
(45) Date of Patent: Mar. 1, 2022

(54) SEMICONDUCTOR DEVICE

(71) Applicant: CSMC TECHNOLOGIES FAB2 CO., LTD., Wuxi New District (CN)

(72) Inventor: Guangyang Wang, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/772,031

(22) PCT Filed: Jan. 15, 2019

(86) PCT No.: PCT/CN2019/071724
§ 371 (c)(1),
(2) Date: Jun. 11, 2020

(87) PCT Pub. No.: WO2019/192243
PCT Pub. Date: Oct. 10, 2019

(65) Prior Publication Data
US 2020/0395452 A1    Dec. 17, 2020

(30) Foreign Application Priority Data

Apr. 4, 2018    (CN) .......................... 201810301083.6

(51) Int. Cl.
*H01L 29/40*    (2006.01)
*H01L 29/06*    (2006.01)
(Continued)

(52) U.S. Cl.
CPC ........ *H01L 29/402* (2013.01); *H01L 29/0653* (2013.01); *H01L 29/7816* (2013.01); *H01L 29/7835* (2013.01); *H01L 23/5226* (2013.01)

(58) Field of Classification Search
CPC ............... H01L 23/485; H01L 23/4821; H01L 23/5226; H01L 28/402; H01L 28/7816;
(Continued)

(56) References Cited

U.S. PATENT DOCUMENTS

2003/0132459 A1    7/2003    Lee et al.
2006/0270171 A1    11/2006   Chen et al.
(Continued)

FOREIGN PATENT DOCUMENTS

CN    101079446 A    11/2007
CN    101714552 A    5/2010
(Continued)

OTHER PUBLICATIONS

International Search Report dated Apr. 18, 2019 in the parent application PCT/CN2019/071724 (2 pages).
(Continued)

*Primary Examiner* — Galina G Yushina
(74) *Attorney, Agent, or Firm* — Polsinelli PC

(57) ABSTRACT

A semiconductor device includes a semiconductor substrate, a field oxide layer, a gate region and field plate integrated structure and a plurality of contact holes. A body region and a drift region are formed in the semiconductor substrate. An active region is formed in the body region, and a drain region is formed in the drift region. A field oxide layer is located on the drift region and the drift region surrounds a part of the field oxide layer. An integrated structure including a gate region and a field plate, the integrated structure extending from above the field oxide layer to above the body region. A depth of a contact hole closer to the source region penetrating into the field oxide layer is greater than a depth of a contact hole closer to the drain region penetrating into the field oxide layer.

12 Claims, 1 Drawing Sheet

(51) Int. Cl.
*H01L 29/78* (2006.01)
*H01L 23/522* (2006.01)

(58) Field of Classification Search
CPC .............. H01L 29/404; H01L 29/0653; H01L 29/7835
See application file for complete search history.

(56) References Cited

U.S. PATENT DOCUMENTS

| | | | |
|---|---|---|---|
| 2014/0167158 A1* | 6/2014 | Pan ..................... | H01L 27/0922 |
| | | | 257/338 |
| 2014/0225192 A1* | 8/2014 | Lee ...................... | H01L 29/407 |
| | | | 257/339 |
| 2015/0325693 A1* | 11/2015 | Mori ................... | H01L 29/0882 |
| | | | 257/339 |
| 2016/0336410 A1* | 11/2016 | Hsiao ................. | H01L 29/7835 |

FOREIGN PATENT DOCUMENTS

| CN | 106298912 A | 1/2017 |
|---|---|---|
| JP | 2007-200981 A | 8/2007 |

OTHER PUBLICATIONS

Chinese Office Action dated May 22, 2020 issued in corresponding Patent Application No. 201810301083.6 (5 pages).

* cited by examiner

SEMICONDUCTOR DEVICE

CROSS REFERENCES TO RELATED APPLICATIONS

This patent application claims priority to Chinese patent application No. 201810301083.6, filed on Apr. 4, 2018, the disclosure of which is hereby incorporated by reference in its entirety.

TECHNICAL FIELD

The present disclosure relates to the field of semiconductor technology, and particularly relates to a semiconductor device.

BACKGROUND

With the continuous development of semiconductor technology, a Lateral Double Diffused MOSFET (LDMOS) device has good short channel characteristics. The LDMOS device has a lightly doped implanted region at the drain electrode, called the drift region. The lower the doping concentration of the drift region, the more the drift region is depleted, the higher the breakdown voltage (BV), and the greater the on-resistance (Rdson). Although the withstand voltage of the device is improved, the increase of the on-resistance will decrease the driving ability of the device. The higher the doping concentration of the drift region, the less the drift region is depleted, the lower the breakdown voltage, and the smaller the on-resistance. Although the smaller on-resistance improves the driving capability of the device, the voltage withstand capability of the device is reduced.

In view of the contradiction between the design of the breakdown voltage and the design of the on-resistance in the LDMOS device, in the conventional technology, the depletion of the drift region is mainly increased by using a field plate structure, and the withstand voltage is increased on the basis that the on-resistance is basically unchanged. The speed of the depletion depends on the thickness of the field oxide layer or the thickness of the shallow trench isolation (STI). The smaller the thickness of the field oxide layer, the greater the depletion of the drift region enhanced by the field plate structure. On the basis that the on-resistance is basically unchanged, the breakdown voltage can be increased. However, the thickness of the field oxide layer cannot be reduced infinitely, thus the depletion of the drift region cannot be enhanced infinitely, and the increase of the breakdown voltage is limited. In addition, the strength of the electric field between the drain electrode and the gate electrode will also limit the increase of the breakdown voltage, so that a breakdown is easy to occur after the field oxide layer between the drain electrode and the gate electrode becomes thin.

Therefore, it is necessary to propose a new LDMOS device to solve the above technical problems.

SUMMARY

According to various embodiments of the present disclosure, a semiconductor device is provided.

A semiconductor device includes:

a semiconductor substrate, a body region and a drift region are formed in the semiconductor substrate, a source region is formed in the body region, and a drain region is formed in the drift region;

a field oxidation layer, the field oxidation layer is located on the drift region, and the drift region surrounds at least a part of the field oxidation layer;

a gate region and field plate integrated structure, the gate region and field plate integrated structure extends from a position over the field oxide layer, and then to a position over the semiconductor substrate, and finally to a position over the body region; and a plurality of contact holes, the plurality of contact holes penetrating into the field oxidation layer, a depth of penetration into the field oxide layer by a contact hole closer to the source region is larger than a depth of penetration into the field oxide layer by a contact hole closer to the drain region.

The details of one or more embodiments of this disclosure are set forth in the accompanying drawings and description below. Other features, objects and advantages of the present disclosure will become apparent from the description, the accompanying drawings, and the claims.

BRIEF DESCRIPTION OF THE DRAWINGS

To better describe and illustrate embodiments and/or examples of the disclosure disclosed herein, reference can be made to one or more accompanying drawings. The additional details or examples used to describe the accompanying drawings should not be construed as limiting the scope of any of the disclosed disclosure, the presently described embodiments and/or examples, and the presently understood preferred mode of the disclosure.

DETAILED DESCRIPTION

Figure 1:
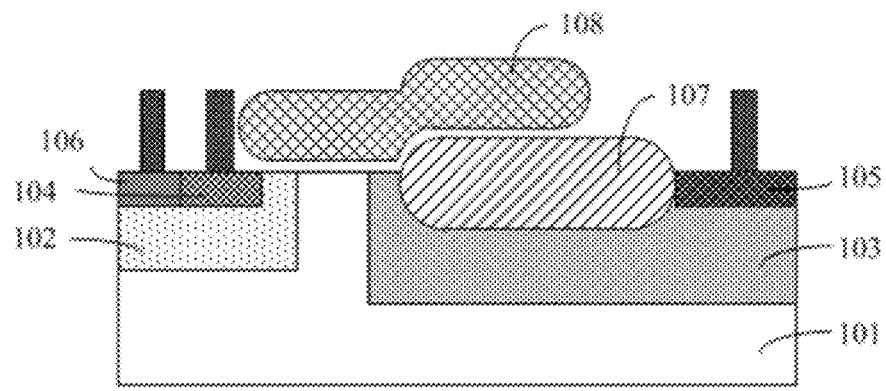
FIG. 1 shows a schematic cross-sectional view of a conventional technology LDMOS device.

In the description hereafter, numerous specific details are set forth in order to provide a more thorough understanding of the present disclosure. However, it will be apparent to those skilled in the art that the present disclosure may be implemented without one or more of these details. In other examples, in order to avoid confusion with the present disclosure, some technical features known in the art are not described.

It should be understood that the present disclosure can be embodied in different forms and should not be construed as limited to the embodiments set forth herein. Rather, providing these embodiments will make the disclosure thorough and complete, and fully convey the scope of the present disclosure to those skilled in the art. In the accompanying drawings, the sizes and relative sizes of layers and regions may be exaggerated for clarity. The same reference numerals denote the same elements from beginning to end.

It should be understood that, when an element or layer is described as being "on", "adjacent to", "connected to" or "coupled to" another element or layer, it can be directly on, adjacent to, connected to, or coupled to the other element or layer, or there can be an intermediate element. In contrast, when an element is described as being "directly on", "directly adjacent to", "directly connected to", or "directly coupled to" another element or layer, there are no intermediate element or layer. It should be understood that, although the terms of "first", "second", "third", and so on can be used to describe various elements, components, regions, layers and/or portions, these elements, components, regions, layers and/or portions should not be limited by these terms. These terms are merely used to distinguish an element, component, region, layer or portion from another element, component, region, layer or portion. Thus, the first element, component, region, layer or portion discussed below can be described as a second element, component, region, layer or portion without departing from the teachings of the present disclosure.

Spatial relation terms such as "below", "beneath", "under", "above", "on", etc., can be used herein for convenience of description to describe the relationship between an element or feature and another element or feature shown in the figures. It should be understood that, in addition to the orientations shown in the figures, the spatial relationship terms are intended to include different orientations of the devices in use and operation. For example, if a device in the figures is turned over, then the element or feature described as "below" or "beneath" another element or feature would then be oriented as "above" the other element or feature. Thus, the exemplary terms "below" and "beneath" can include both orientations of above and below. The device may be otherwise oriented (rotated 90 degrees or otherwise) and the spatial descriptions used herein are interpreted accordingly.

Terms used herein are for the purpose of describing specific embodiments only and are not intended to be limiting of the present disclosure. As used herein, "a", "one" and "said/the" in singular forms are also intended to include a plural form unless the context clearly indicates other forms. It should also be understood that the terms "consist" and/or "include" when used in the description, determine presence of the features, integers, steps, operations, elements and/or components, but do not exclude the presence or addition of one or more other features, integers, steps, operations, elements, components, and/or groups. As used herein, the terms "and/or" include any and all combinations of related listed items.

In order to thoroughly understand the present disclosure, detailed steps and/or detailed structures will be set forth in the following description, so as to explain the technical solutions proposed by the present disclosure. Preferred embodiments of the present disclosure are described in detail below, however in addition to these detailed descriptions, the present disclosure may have other embodiments.

FIG. 1 shows a schematic cross-sectional view of a conventional LDMOS device, which includes: a P type substrate 101, and a P type body region 102 and an N type drift region 103 located in the P type substrate 101; a body lead-out region 106 and a source region 104 are formed in the P type body region 102, and a drain region 105 is formed in the N type drift region 103; a field oxide layer 107 and an integrated structure 108 that includes a gate region and a field plate (herein referred to as the "gate region and field plate integrated structure" extending from a position above the field oxide layer 107, and then to a position above the semiconductor substrate 101, and finally to a position above the P type body region 102 are formed on the drift region 103. In this LDMOS device, the depletion of the drain drift region is increased by forming the gate region and field plate integrated structure. The rate of the depletion depends on the thickness of the field oxide layer or the thickness of the shallow trench isolation (STI). The smaller the thickness of the field oxide layer, the greater the depletion of the drift region enhanced by the gate region and field plate integrated structure 108. On the basis that the on-resistance is basically unchanged, the breakdown voltage can be increased. However, the thickness of the field oxide layer cannot be reduced infinitely, thus the depletion of the drift region cannot be enhanced infinitely, and the increase of the breakdown voltage is limited. In addition, the strength of the electric field between a drain electrode and a gate electrode will also limit the increase of the breakdown voltage, so that a breakdown is easy to occur after the field oxide layer between the drain electrode and the gate electrode becomes thin.

Figure 2A:
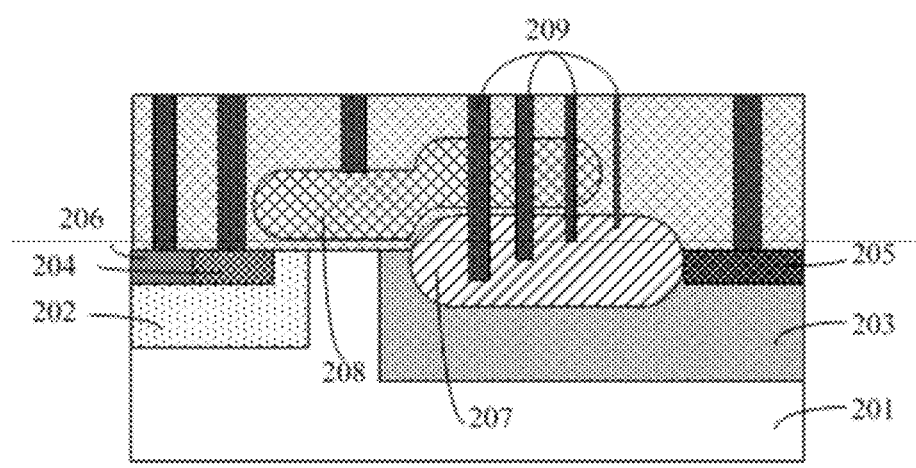
FIG. 2A is a schematic cross-sectional view of a LDMOS device according to an exemplary embodiment of the present disclosure.

A semiconductor device according to an exemplary embodiment of the present disclosure will be described in detail below with reference to FIG. 2A.

A semiconductor substrate 201. A body region 202 and a drift region 203 are formed in the semiconductor substrate 201. A source region 204 is formed in the body region 202 and a drain region 205 is formed in the drift region 203. A field oxide layer 207 is located on the drift region 203, and the drift region 203 surrounds at least a part of the field oxide layer 207. A gate region and field plate integrated structure 208 is provided extending from a position over the field oxide layer 207, and then to a position over the semiconductor substrate 201, and finally to a position over the body region 202. That is, the gate region and field plate integrated structure 208 overlaps at least partially with the field oxide layer 207, and overlaps partially with the semiconductor substrate 201, and overlaps at least partially with the body region 202. A plurality of contact holes 209 penetrates into the field oxide layer 207, a depth of penetration into the field oxide layer 207 by a contact hole 209 closer to the source region 204 is greater than a depth of penetration into the field oxide layer 207 by a contact hole 209 closer to the drain region 205.

Exemplarily, the semiconductor device of the present disclosure includes a Laterally Diffused Metal Oxide Semiconductor (LDMOS) device. Specifically, the present disclosure provides a Reduced Surface Field (RESURF) type LDMOS device.

Exemplarily, the semiconductor device of the present disclosure includes a first conductivity type and a second conductivity type. Exemplarily, the first conductivity type is P type and the second conductivity type is N type, the doping ions of the P type includes, but are not limited to, boron ions, and the doping ions of the N type includes, but are not limited to, phosphorus ions or arsenic ions.

The LDMOS device of the present disclosure includes a semiconductor substrate 201. The semiconductor substrate 201 can be at least one of the following mentioned materials: silicon, silicon on insulator (SOI), stacked silicon on insulator (SSOI), stacked silicon germanium on insulator (S—SiGeOI), silicon germanium on insulator (SiGeOI), germanium on insulator (GeOI), and the like. In this embodiment, the semiconductor substrate 201 is a silicon substrate and has the first conductivity type or the second conductivity type.

Exemplarily, a P well is formed as a body region 202 in the semiconductor substrate 201. As an example, a standard well implantation process is used to form the P well in the semiconductor substrate. The P well can be formed by a high energy implantation process, or the P well can be formed by a low energy implantation in combination with a high temperature thermal annealing process.

Exemplarily, a drift region (Drift) 203 is further formed in the semiconductor substrate 201. The drift region 203 is located in the semiconductor substrate 201 and is typically a lightly doped region. For an N trench LDMOS, the drift region is N type doped. As an example, the drift region 203 and the P well are formed in a similar manner, and may be formed by a high energy implantation process, or may be formed by a low energy implantation in combination with a high temperature thermal annealing process.

In the above embodiment, the semiconductor substrate 201 has a first conductivity type or a second conductivity type, the body region 202 has a first conductivity type, and the drift region 203 has a second conductivity type, to form an NLDMOS device. In another embodiment, the semiconductor substrate 201 has a first conductivity type or a second conductivity type, the body region 202 has a second conductivity type, and the drift region 203 has a first conductivity type, to form a PLDMOS device.

Further, a source region 204 and a body lead-out region 206 are formed in the body region 202, and a drain region 205 is formed in the drift region 203. A source electrode 210 and a drain electrode 211 can be respectively led out from the source region 204 and the drain region 205. As an example, an N type impurity is implanted into the body region 202 to form the source region 204, and an N type impurity is implanted into the drift region 203 to form the drain region 205. The doping concentration of the source region 204 and the doping concentration of the drain region 205 may be the same. Therefore, the source region 204 and the drain region 205 can be formed by doping simultaneously. As an example, a P type impurity is implanted into the body region 202 to form the body lead-out region 206.

The LDMOS device of the present disclosure further includes a field oxide layer 207. The field oxide layer 207 is located on the drift region 203 and the drift region 203 surrounds at least a part of the field oxide layer 207. Specifically, an upper surface of the field oxide layer 207 is flush with an upper surface of the drift region 203, or the upper surface of the field oxide layer 207 is higher than the upper surface of the drift region 203. Exemplarily, a material of the field oxide layer 207 is silicon oxide, and the field oxide layer 207 can be formed by any of the methods well known to those skilled in the art. Specifically, a silicon dioxide layer is grown on a surface of the semiconductor substrate, the silicon dioxide layer is patterned using a photolithography process, and the remaining silicon dioxide layer is thermally oxidized to form the field oxide layer 207.

Further, in case that a conductivity type of the drift region 203 is different from a conductivity type of the semiconductor substrate 201, the drift region 203 surrounds the entire bottom surface of the field oxide layer 207, that is, the field oxide layer 207 and the semiconductor substrate 201 are completely separated by the drift region 203.

The LDMOS device of the present disclosure further includes a gate region and field plate integrated structure 208. The gate region and field plate integrated structure 208 extends from a position over the field oxide layer 207, and then to a position over the semiconductor substrate 201, and finally to a position over the body region 202, as shown in FIG. 2A. Exemplarily, a side of the gate region and field plate integrated structure 208 close to the body region 202 extends to a position over the body region 202, the gate region and field plate integrated structure 208 overlaps with the body region 202 at least partially, and a material of the gate region and field plate integrated structure 208 is polysilicon.

The LDMOS device of the present disclosure further includes a dielectric layer, and the dielectric layer covers the semiconductor substrate 201, the field oxide layer 207, and the gate region and field plate integrated structure 208. In the gate region and field plate integrated structure 208, a part of the gate region and field plate integrated structure 208 stacked on the field oxide layer 207 is a field plate structure 2081, and the rest part thereof is a gate region 2082. Contact holes penetrating the dielectric layer are formed in the dielectric layer above the source region 204, the drain region 205, the gate region 2082 in the gate region and field plate integrated structure 208, and the body lead-out region 206, respectively, to lead out the source electrode 210, the drain electrode 211, and the gate electrode 212. The contact holes 209 penetrating into the field oxide layer 207 reach the gate electrode 212. The contact holes for leading out the source electrode 210 reach a surface of the source region 204 and a surface of the body lead region 206, the contact hole for leading out the drain electrode 211 reaches a surface of the drain region 205, and the contact hole for leading out the gate electrode 212 reaches a surface of the gate region 2082 in the gate region and field plate integrated structure 208.

In the LDMOS device provided in the present disclosure, a plurality of contact holes 209 are further formed, and the plurality of contact holes 209 penetrate into the field oxide layer 207, a depth of penetration into the field oxide layer 207 by a contact hole 209 closer to the source region 204 is larger than a depth of penetration into the field oxide layer 207 by a contact hole 209 closer to the drain region 205. By controlling the depths of penetration into the field oxide layer 207 of the contact holes 209 to be different, the effective thickness of the field oxide layer 207 closer to the drain electrode 211 is appropriately thickened, and the effective thickness of the field oxide layer 207 away from the drain electrode 211 is appropriately thinned, thereby not only maximally enhancing the depletion of the drift region 203, but also solving the problem of limiting the breakdown voltage (BV) of the field oxide layer 207. In addition, the depths of penetration into the field oxide layer 207 by the contact holes 209 are different, which facilitates the adjustment for different effective thicknesses of the field oxide layer 207, and has a flexible structure and is easy to control. Compared with a device that does not use the LDMOS device structure of the present disclosure, the present disclosure can effectively increase the breakdown voltage and optimize the on-resistance without reducing the overall thickness of the field oxide layer.

Further, an opening size of a contact hole 209 closer to the source region 204 is larger than an opening size of a contact hole 209 closer to the drain region 205. By changing the opening sizes of the contact holes 209, the rate of etching the field oxide layer 207 can be controlled, thereby achieving the formation of the contact holes 209 with different depths to deplete the drift region 203, and better forming effective stepped thicknesses of the field oxide layer to optimize the depletion.

Further, at least a part of the plurality of contact holes 209 penetrate through the gate region and field plate integrated structure 208. With a part of the contact holes 209 penetrating through the gate region and field plate integrated structure 208, it is more conducive to enhancing the depletion of the drift region below the gate region and field plate integrated structure 208. In addition, the contact hole 209 is formed by a directly etching on the gate region and field plate integrated structure 208, which is easier to control the etching rate than by etching the dielectric layer, and is more conducive to forming contact holes 209 with different depths.

In addition, compared with the conventional technology, the formation of the above described LDMOS device does not need to introduce new process steps, and therefore will not cause an increase in production costs.

Figure 2B:
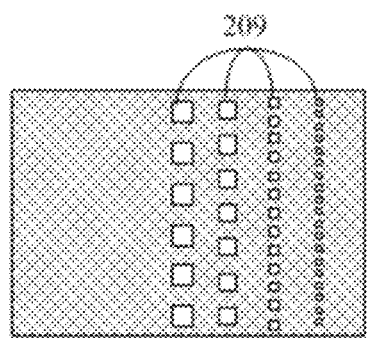
FIG. 2B is a partial schematic diagram of a top view of a LDMOS device according to an exemplary embodiment of the present disclosure.

Exemplarily, the plurality of contact holes 209 can be divided into several groups. The contact holes 209 in each group have a same opening size and a same depth of penetration into the field oxide layer 207. In two adjacent groups, the contact holes 209 in the group closer to the source electrode 210 have an opening size larger than that of the contact holes 209 in the group closer to the drain electrode 211, and the contact holes 209 in the group closer to the source electrode 210 have a depth of penetration into the field oxide layer 207 larger than that by the contact holes 209 in the group closer to the drain electrode 211. As an example, as shown in FIGS. 2A and 2B, the contact holes 209 are divided into four groups. And from a first group adjacent to the source electrode 210 to a fourth group adjacent to the drain electrode 211, the openings of the contact holes 209 gradually decreases and the depths of penetration into the field oxide layer 207 thereof also gradually decreases. The contact holes 209 of the first to third groups penetrate through the gate region and field plate integrated structure 208.

In the LDMOS device provided in the present disclosure, by forming the contact holes penetrating into the field oxide layer, and controlling a depth of penetration into the field oxide layer by a contact holes closer to the source region to be greater than a depth of penetration into the field oxide layer by a contact hole closer to the drain region, so that an effective thickness of the field oxide layer closer to the drain electrode is greater than an effective thickness of the field oxide layer away from the drain electrode, thereby not only enhancing the depletion of the drift region, but also maximumly optimizing the breakdown voltage and on-resistance of the LDMOS device. Since there is no limitation that the thickness of the field oxide layer cannot be reduced infinitely, the depletion of the drift region is further enhanced, the breakdown voltage can be increased to a greater extent, and the field oxide layer between the drain electrode and the gate electrode is not easy to breakdown. In addition, forming the LDMOS device of the present disclosure will not increase production costs.

The present disclosure has been described through the above embodiments, but it should be understood that, the above embodiments are merely for the purpose of illustration and description, and are not intended to limit the present disclosure to the scope of the described embodiments. In addition, those skilled in the art can understand that, the present disclosure is not limited to the above described embodiments, further variations and modifications can be made according to the teachings of the present disclosure, and these variations and modifications all fall within the claimed protection scope of the present disclosure. The protection scope of the present disclosure is defined by the appended claims and equivalent scope thereof.

What is claimed is:

1. A semiconductor device, comprising:
   a semiconductor substrate, a body region and a drift region being formed in the semiconductor substrate, a source region being formed in the body region, and a drain region being formed in the drift region;
   a field oxidation layer, the field oxidation layer being located on the drift region, and the drift region surrounding at least a part of the field oxidation layer;
   an integrated structure including a gate region and a field plate region, the integrated structure extending from above the field oxide layer to above the body region;
   a plurality of contact holes, the plurality of contact holes penetrating into the field oxidation layer, wherein a depth of penetration into the field oxide layer by a contact hole closer to the source region is larger than a depth of penetration into the field oxide layer by a contact hole closer to the drain region;
   the plurality of contact holes being divided into four groups wherein:
     contact holes in a same group of the four groups have a same opening size and a same depth of penetration into the field oxide layer;
     in two adjacent groups of the four groups, contact holes in a group closer to the source region have an opening size larger than contact holes in a group closer to the drain region, and a depth of penetration into the field oxide layer by the contact holes in the group closer to the source region is larger than a depth of penetration into the field oxide layer by the contact holes in the group closer to the drain region;
     the four groups comprises a first group to a fourth group in from closer to the source region to closer to the drain region, where contact holes of the first group to a third group penetrate through the gate region and field plate integrated structure, and contact holes of the fourth group are spaced apart from the gate region and field plate integrated structure and directly penetrate into the field oxide layer; and
   wherein a conductivity type of the drift region is different from a conductivity type of the semiconductor substrate, and the field oxide layer and the semiconductor substrate are completely separated by the drift region.

2. The semiconductor device according to claim 1, further comprising:
   a body lead-out region, the body lead-out region being formed in the body region and being adjacent to the source region.

3. The semiconductor device according to claim 1, wherein an upper surface of the field oxide layer is higher than an upper surface of the drift region.

4. The semiconductor device according to claim 1, wherein the semiconductor device comprises a Laterally Diffused Metal Oxide Semiconductor (LDMOS) device.

5. The semiconductor device according to claim 4, wherein the body region is P type doped and the drift region is N type doped to form an NLDMOS device.

6. The semiconductor device according to claim 4, wherein the body region is N type doped and the drift region is P type doped to form a PLDMOS device.

7. The semiconductor device according to claim 1, wherein a material of the integrated structure is polysilicon.

8. The semiconductor device according to claim 1, wherein a material of the field oxide layer is silicon oxide.

9. The semiconductor device according to claim 1, wherein the source region and the drain region have a same doping concentration.

10. The semiconductor device of claim 2, further comprising:
    a dielectric layer, the dielectric layer covering the semiconductor substrate, the field oxide layer, and the integrated structure;
    in the integrated structure, a part of the integrated structure stacked on the field oxide layer is the field plate region, and a part of the integrated structure not stacked on the field oxide layer is the gate region; and
    contact holes penetrating through the dielectric layer being formed respectively in the dielectric layer above the source region, the drain region, the gate region, and the body lead-out region, to lead out the source region, the drain region, and the gate region.

11. The semiconductor device according to claim 1, wherein the drift region is a lightly doped region.

12. The semiconductor device according to claim 1, wherein the semiconductor substrate is a silicon substrate.

* * * * *